(12) United States Patent
Morton et al.

(10) Patent No.: US 9,559,484 B2
(45) Date of Patent: Jan. 31, 2017

(54) LOW NOISE, HIGH POWER, MULTIPLE-MICRORESONATOR BASED LASER

(71) Applicants: Paul A. Morton, West Friendship, MD (US); Jacob Khurgin, Pikesville, MD (US)

(72) Inventors: Paul A. Morton, West Friendship, MD (US); Jacob Khurgin, Pikesville, MD (US)

(73) Assignee: Morton Photonics Inc., West Friendship, MD (US)

(*) Notice: Subject to any disclaimer, the term of this patent is extended or adjusted under 35 U.S.C. 154(b) by 0 days.

(21) Appl. No.: 14/828,846

(22) Filed: Aug. 18, 2015

(65) Prior Publication Data

US 2016/0049767 A1 Feb. 18, 2016

Related U.S. Application Data

(60) Provisional application No. 62/038,428, filed on Aug. 18, 2014.

(51) Int. Cl.
| | |
|---|---|
| H01S 3/10 | (2006.01) |
| H01S 3/081 | (2006.01) |
| H01S 3/083 | (2006.01) |
| H01S 5/10 | (2006.01) |
| H01S 5/14 | (2006.01) |
| H01S 5/02 | (2006.01) |

(52) U.S. Cl.
CPC ............ *H01S 3/083* (2013.01); *H01S 5/1032* (2013.01); *H01S 5/142* (2013.01); *H01S 3/10053* (2013.01); *H01S 5/021* (2013.01)

(58) Field of Classification Search
CPC .... H01S 3/083; H01S 3/10053; H01S 3/1022; H01S 3/10038
See application file for complete search history.

(56) References Cited

U.S. PATENT DOCUMENTS

| | | | | |
|---|---|---|---|---|
| 2006/0198415 A1* | 9/2006 | Yamazaki | .......... | G02B 6/12007 372/94 |
| 2006/0222038 A1* | 10/2006 | Yamazaki | ............. | H01S 5/0612 372/94 |
| 2008/0025358 A1* | 1/2008 | Arahira | ............... | H01S 5/06256 372/38.02 |
| 2009/0059973 A1* | 3/2009 | Suzuki | .................... | H01S 5/142 372/20 |
| 2009/0244544 A1* | 10/2009 | Terrel | .................... | G01C 19/727 356/461 |
| 2011/0013654 A1* | 1/2011 | Yamazaki | ............. | H01S 5/0687 372/29.02 |

(Continued)

*Primary Examiner* — Yuanda Zhang
(74) *Attorney, Agent, or Firm* — Nadya Reingand

(57) ABSTRACT

This invention provides ultra-low noise lasers with exceptional performance through the use of ultra-low loss microresonator based filters/reflectors including multiple (≥3) microresonator rings with different ring radii. The ultra-low loss microresonators provide a long effective laser cavity length enabling very narrow linewidth laser operation, with multiple (≥3) microresonators providing extremely high selectivity of the lasing mode over a very wide wavelength range; supporting single wavelength and widely tunable wavelength laser operation. The highly selective and also low loss filter/reflector supports high output power operation of the lasers.

10 Claims, 11 Drawing Sheets

(56) References Cited

U.S. PATENT DOCUMENTS

| | | | | |
|---|---|---|---|---|
| 2011/0019955 A1* | 1/2011 | Morton | ............... | G02F 1/011 |
| | | | | 385/1 |
| 2011/0038036 A1* | 2/2011 | Todt | ............... | H01S 5/0264 |
| | | | | 359/341.1 |
| 2011/0164299 A1* | 7/2011 | Morton | ............... | G02F 1/011 |
| | | | | 359/238 |
| 2012/0189025 A1* | 7/2012 | Zheng | ............... | H01S 5/1071 |
| | | | | 372/20 |
| 2015/0016767 A1* | 1/2015 | Akiyama | ............... | H01S 5/142 |
| | | | | 385/3 |

\* cited by examiner

LOW NOISE, HIGH POWER, MULTIPLE-MICRORESONATOR BASED LASER

CROSS-REFERENCE TO RELATED APPLICATIONS

This patent application claims priority to the U.S. provisional patent application No. 62/038,428 filed on Aug. 18, 2014.

FIELD OF INVENTION

This invention relates to high performance fiber optic and free-space communications systems, and optical sensing systems.

BACKGROUND

The device concepts are based on the use of microresonator rings as the filter elements within a laser cavity, either as part of a reflector at one or both ends of a linear laser cavity, or part of the filter within a ring laser cavity. These laser cavity designs have been used previously with optical microresonator rings forming the filters/reflectors; in these previous cases the devices used a maximum of two microresonators with different ring circumferences, placed in series to provide the filter function, this filter function having limitations leading to reduced laser performance; relatively large linewidth, low output power, poor relative intensity noise (RIN), and limited mode selectivity.

Previous tunable laser designs based on ring reflectors in a linear cavity, using a III-V monolithic semiconductor platform such as "Full C-Band Tuning Operation of Semiconductor Double-Ring Resonator-Coupled Laser With Low Tuning Current" by T. Segawa et al, IEEE PHOTONICS TECHNOLOGY LETTERS, 19, pages 1322-1324, 2007, and "Microring-Resonator-Based Widely Tunable Lasers", by S. Matsuo et al, IEEE JOURNAL of SELECTED TOPICS in QUANTUM ELECTRONICS, 15, pages 545 to 554, 2009, or using a silicon photonics platform such as "Compact, lower-power-consumption wavelength tunable laser fabricated with silicon photonic-wire waveguide micro-ring resonators", by T. Chu T et el, OPTICS EXPRESS, 17, pages 14063 to 14068, 2009, and "25 kHz Narrow Spectral Bandwidth of a Wavelength Tunable Diode Laser with a Short Waveguide-Based External Cavity", by R. M. Oldenbeuving et al, LASER PHYSICS LETTERS, 10, 015804, 2013, utilized a reflector incorporating two microresonator rings with slightly different circumference, and therefore different Free Spectral Range (FSR). These two microresonator rings are tuned using a Vernier approach; one resonance from each ring is aligned to provide a small pass band through the combined filter, all other wavelengths within the gain bandwidth of the gain element being blocked. A ring-cavity laser, also using two microresonator rings and the Vernier effect for tuning, described in "Widely tunable vernier ring laser on hybrid silicon", by J. C. Kulme et al, OPTICS EXPRESS, 21, pages 19718 to 19722, 2013, was fabricated using heterogeneous integration on a silicon photonics platform. A schematic and picture of the monolithically integrated III-V laser by Matsuo is shown in FIG. 1, with the version more recently developed using silicon nitride ($Si_3N_4$) waveguides on an SOI substrate and an external gain chip, by Oldenbeuving, shown in FIG. 2(a); the power reflectivity of the reflector in this device is shown in FIG. 2(b).

The III-V based device in FIG. 1 used the facets on both sides of the laser for reflectors, with the two microresonator rings filtering the signal passing though them in a double pass scheme. The device in FIG. 2(a) had an external gain chip, and achieved reasonable results; C-Band tenability, <25 kHz linewidth, and 50 dB Side Mode Suppression Ratio (SMSR), however, the output power of the laser was very low, only 1 mW. The 50 dB SMSR, while typical for this and other reported devices, and for distributed feedback (DFB) lasers, indicates too high a value for the RIN of the device for use in RF photonics and other high performance applications, as the RIN of a laser is directly proportional to its SMSR value. An SMSR of ~70 dB can be seen in lasers with very low RIN. The designed reflector response for the device in FIG. 2(a) is shown in FIG. 2(b); this reflector has insufficient suppression of reflections from the non-lasing cavity modes to obtain ultra-low noise operation.

One group of previous works utilized two small veguide based microresonator rings with different FSR, e.g. III-V or silicon microresonators, to provide the correct mode selectivity for singlemode lasing; the smaller the rings the higher the FSR, and the higher overall mode selectivity. Tunable lasers that covered the C-Band (1535-1565 nm) were fabricated, however, the relatively high optical loss of silicon or III-V waveguides, especially when used in small microresonators (radii of ~10 microns), e.g. 2 to 4 dB/cm for silicon, gave rise to lossy filters/reflectors, and therefore short effective cavity lengths—which do not provide the required narrow linewidth operation and high power needed for advanced systems. The small microresonators are also operated with high Q, providing very high power density within the rings—leading to self-heating (and changing the ring resonance frequency) and also nonlinear effects within the rings. This limits the possible power levels at which these devices can operate.

A lower loss waveguide/microresonator material, $Si_3N_4$ was used in prior art, where the dual ring microresonator based reflector was coupled to a semiconductor gain chip to form the external cavity laser (ECL) through hybrid integration. Reasonable results were found, but again, by using two microresonator rings and the Vernier effect in the reflector, using low but not ultra-low loss waveguides/microresonators, devices had limited mode selectivity, had low output power and relatively large linewidth.

There is a need for an increase in the effective cavity length of laser devices, while at the same time keeping optical losses low and mode selectivity high over a wide wavelength range, in order to overcome current limitations in laser devices which do not provide sufficiently narrow linewidth operation while also providing high output power and low RIN. There is a need for lasers with this high performance that can operate at a specific wavelength, or be able to be broadly tunable over a wide wavelength range.

SUMMARY

This invention is a novel concept for creating a low noise and high power tunable or fixed wavelength laser. The concept is applicable to both an integrated laser (monolithic or heterogeneously integrated), or a hybrid integrated version using a filter/reflector and separate gain chip. Low noise includes narrow linewidth operation, e.g. 10 kHz down to 10 Hz, to support high performance optical communication systems and fiber sensing systems, and also low RIN operation, e.g. <-155 dB/Hz, again, as required for high performance optical systems. High power is required for use in high performance systems without the need for optical amplification, or for limited booster amplification, with power levels from e.g. 20 mW up to 200 mW being required. Operating wavelengths can include a very wide range, based only upon the availability of semiconductor (or other) gain elements and optical waveguides/filters/reflectors with very low loss, ranging from ultraviolet (UV) e.g. 250 nm out to many microns, e.g. >10 microns.

The laser of the present invention has a cavity with at least three microring resonators interconnected via buses; all microrings have different sets of resonant frequencies; and one resonant frequency is common for all three rings.

DETAILED DESCRIPTION

The concept proposed in this patent application takes advantage of ultra-low loss optical waveguides and microresonator rings, e.g. by utilizing large radii microresonator rings fabricated with ultra-low loss $Si_3N_4$ or other materials. The total loss of a microresonator (in dB/cm) varies with radius, by using different waveguide designs optimized for each radius. A straight waveguide can provide the lowest loss, the design optimized for very low optical confinement, however, these waveguides have significant losses when a bend or a ring is made of the waveguide. Different waveguide materials and designs have losses that vary versus ring radius, and so the optimum waveguide design and ring radius depends on the required waveguide loss—examples of low loss $Si_3N_4$ waveguide designs and losses were previously described.

By moving to lower loss microresonator rings, longer effective laser cavity lengths can be obtained, providing very low linewidth laser operation. Longer cavity lengths require lower loss (per cm) so that the reflector peak reflectivity is still high, and so that it does not absorb significant light and self-heat. Larger microresonator rings have a lower power density for the same filter bandwidth, and therefore limit or eliminate nonlinear effects. However, as the radii of the microresonator rings increase, it becomes more difficult and eventually impossible to provide mode selectivity for singlemode operation with only two microresonators of different FSR using the Vernier effect. Previous attempts to make microresonator based lasers have therefore focused on using smaller radii in order to increase mode selectivity, trading device performance. In the approach of the current invention, large ring radii are used, in order to provide very low linewidth operation with high output power, with the mode selectivity issue being solved by adding one or more additional ring with different ring circumference to the filter/reflector—expanding on the two ring Vernier effect to a 3 ring, 4 ring or higher number of rings based filter.

Figure 3:
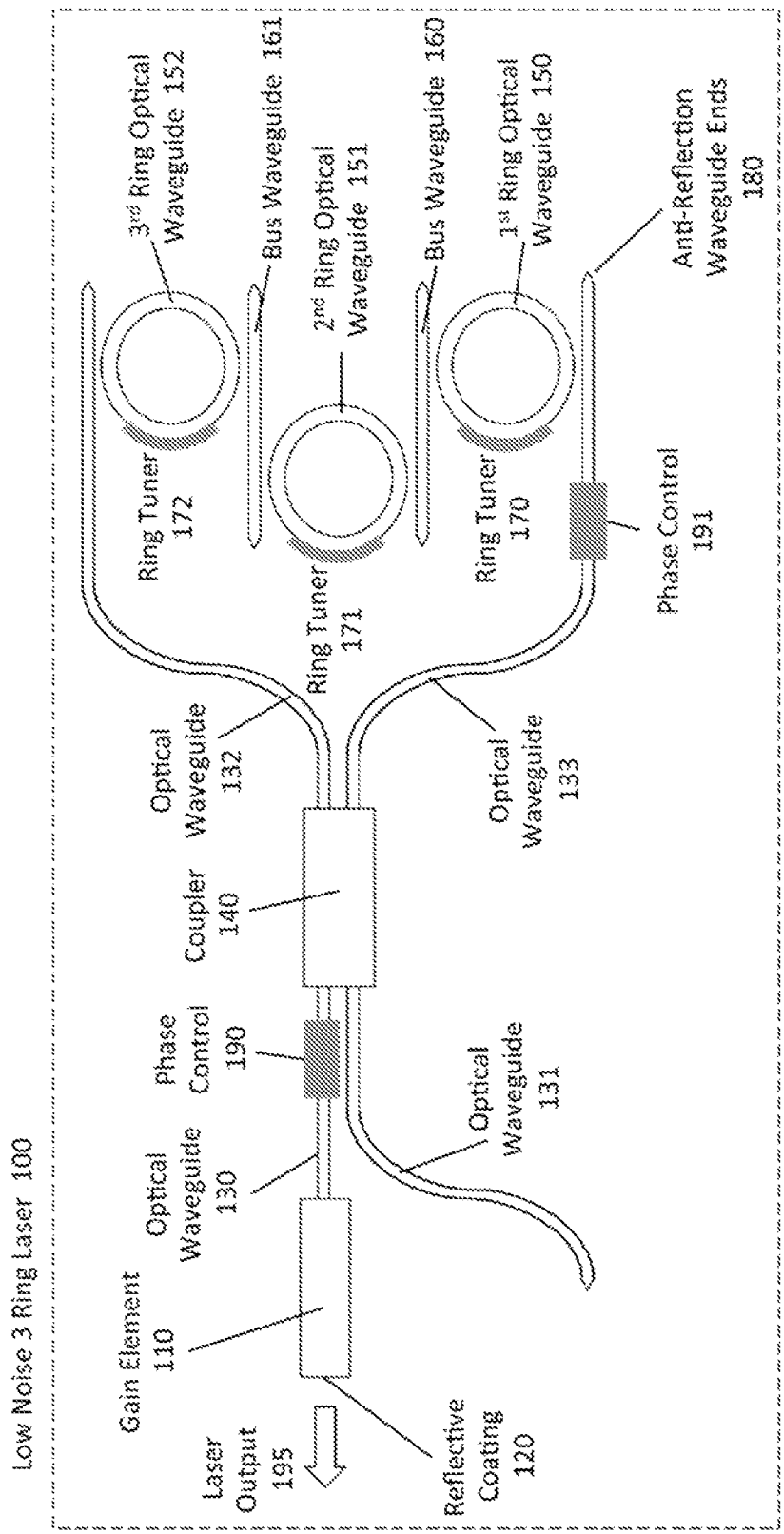
FIG. 3 Schematic of the 3 microresonator ring linear cavity laser design

In a linear cavity laser design, modeling at Morton Photonics showed that the use of 3 microresonator rings made with low loss (e.g. 0.2 dB/cm) $Si_3N_4$ waveguides, with 3 different and appropriately large radii (as required to achieve this low loss in these microresonators), significantly improves the selectivity of a single mode in the laser cavity, compared to a two microresonator design. A schematic of one embodiment of a 3 microresonator based low noise laser source 100 is shown in FIG. 3, in which an optical signal 195 at a single wavelength is created through the combination of the gain element 110 and the mode selection achieved in the laser cavity. The laser cavity is comprised of a broadband reflective coating 120 at one end of the gain element that is chosen to be less than 100% reflective in order to provide the laser output signal 195, plus a Sagnac Loop reflector that creates the other end of the linear laser cavity, the Sagnac loop reflector being comprised of 3 ring optical waveguides (150, 151 and 152) with different ring radii (and therefore different FSR) interconnected with bus waveguides 160 and 161—the loop reflector providing a long effective cavity length plus the required mode selectivity. The gain element 110 is connected to the optical waveguide of the laser cavity 130 either directly for a monolithic (e.g. silicon photonics based) device, or through hybrid integration (e.g. with a lens) for a hybrid integrated laser. The Sagnac loop comprises a coupler 140, either a 2×2 directional coupler as shown in FIG. 3, or alternative coupler designs. In the preferred embodiment, a 50%/50% coupler is used to split the optical power coming from the gain element into the two optical waveguides (132 and 133) leaving the coupler 140, which pass through a phase control element 191 and the 3 ring optical waveguides 150, 151 and 152, before being re-combined at the coupler to complete the Sagnac loop and provide a wavelength selective reflector for the laser cavity with all of the energy reflected back to the gain element. If a different splitting ratio is achieved, either by design or by utilizing a tunable coupler for 140, an output can be taken from the 4$^{th}$ waveguide of the coupler 140, i.e. the optical waveguide 131. Anti-reflection waveguide ends 180 (e.g. waveguides tapered down to a zero width over a long length) are added to the ends of all unused optical waveguides to avoid optical reflections at those waveguide ends from degrading the reflection response of the Sagnac loop based wavelength selective optical reflector. The resonance frequencies of each of the 3 ring optical waveguides 150, 151, 152, can be independently tuned using ring tuners 170, 171 and 172 respectively. The phase control element 190 controls the laser cavity phase in order to control the exact wavelength of the lasing mode relative to the reflector peak wavelength. The Sagnac loop reflector phase control 191, together with the resonance frequency ring tuners of the 3 rings 170, 171, and 172 are used to control the peak reflection wavelength of the Sagnac loop based reflector. The wavelength of the laser is chosen by aligning all of the ring optical wavelengths near the desired optical wavelength, then setting the reflector phase and cavity phase to place the optical cavity mode at the desired wavelength relative to the reflector peaks; laser linewidth and SlN depend on the exact tuning between the reflector peak and the laser mode wavelength, e.g. lower linewidth being achieved by moving the lasing mode to the long wavelength side of the reflection peak.

Figure 1:
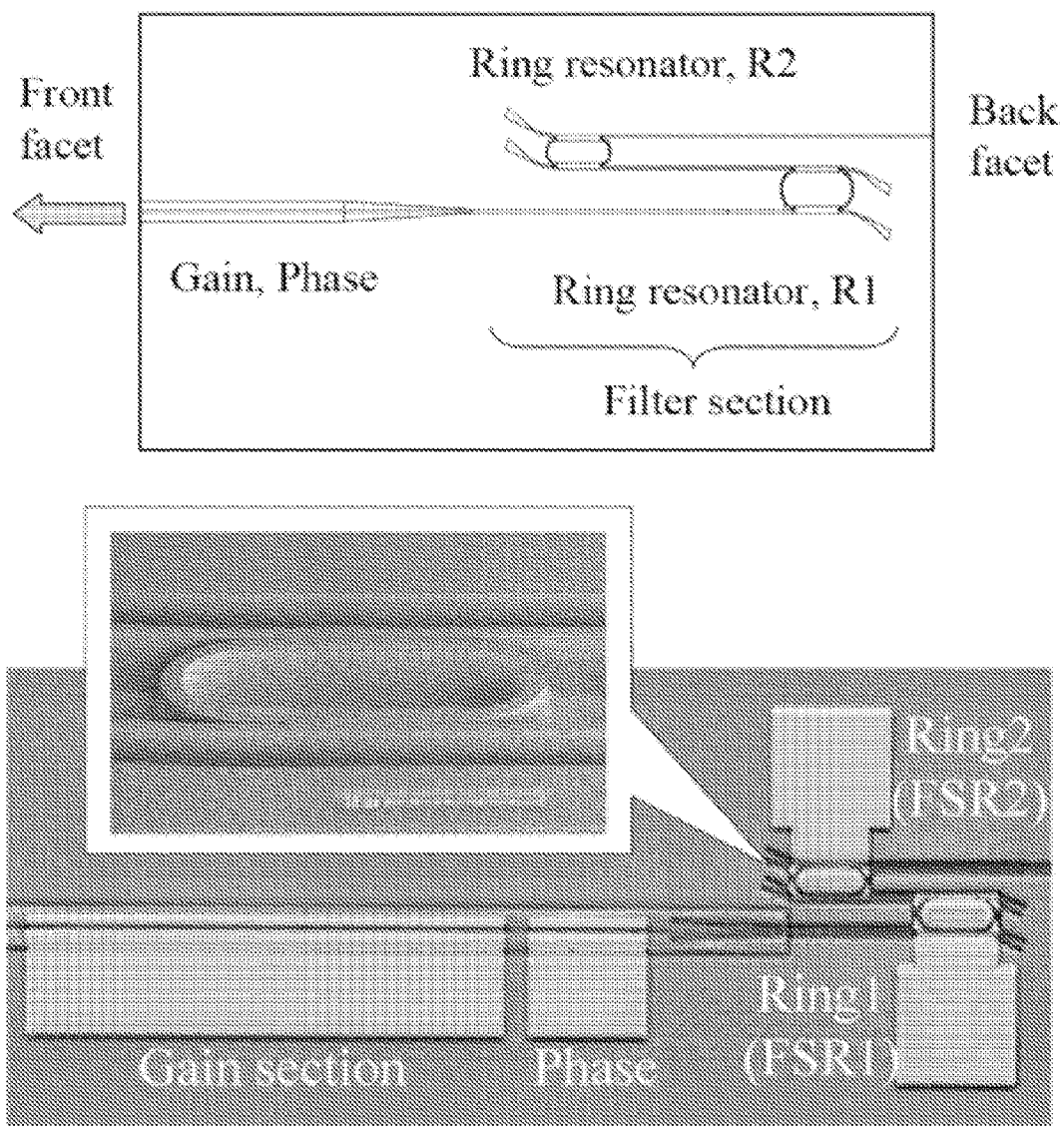
FIG. 1 (a) Related art by Matsuo showing the laser structure design fabricated monolithically of III-V semiconductors which include two microresonators (R1 and R2) with different ring radii, using the vernier approach to provide mode selectivity.
Figure 2:
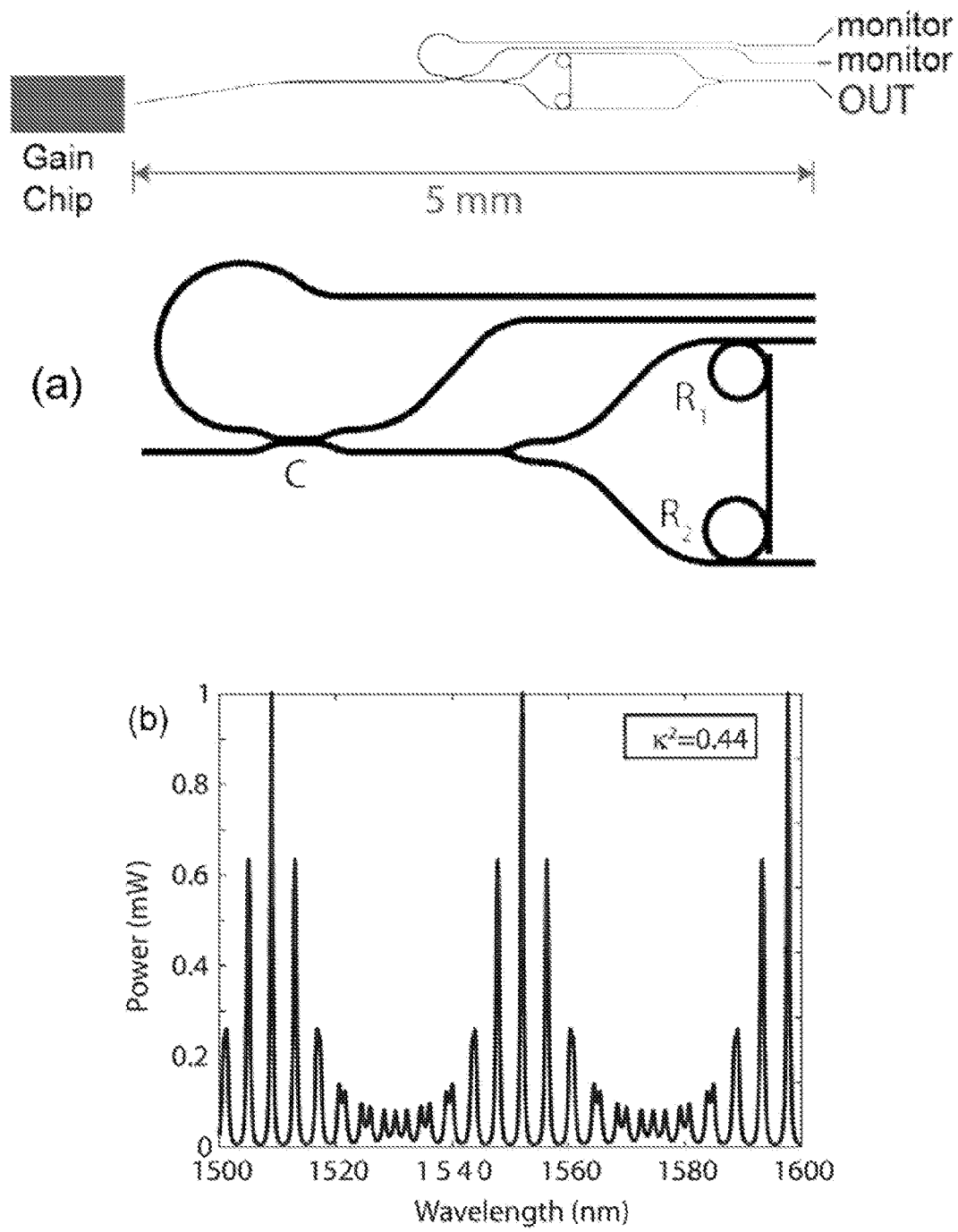
FIG. 2 Related art by Oldenbeuving, showing (a) the laser structure design—both the complete device and a zoom-in view of the reflector structure, which include two microresonators with different ring radii, and (b) the calculated reflection spectrum of the 2 microresonator design—showing an FSR of 44 nm, a secondary mode reflection power of 0.63 (for a suppression of the 2 modes of 2 dB), and a peak reflection bandwidth of 0.51 nm (64 GHz).
Figure 4:
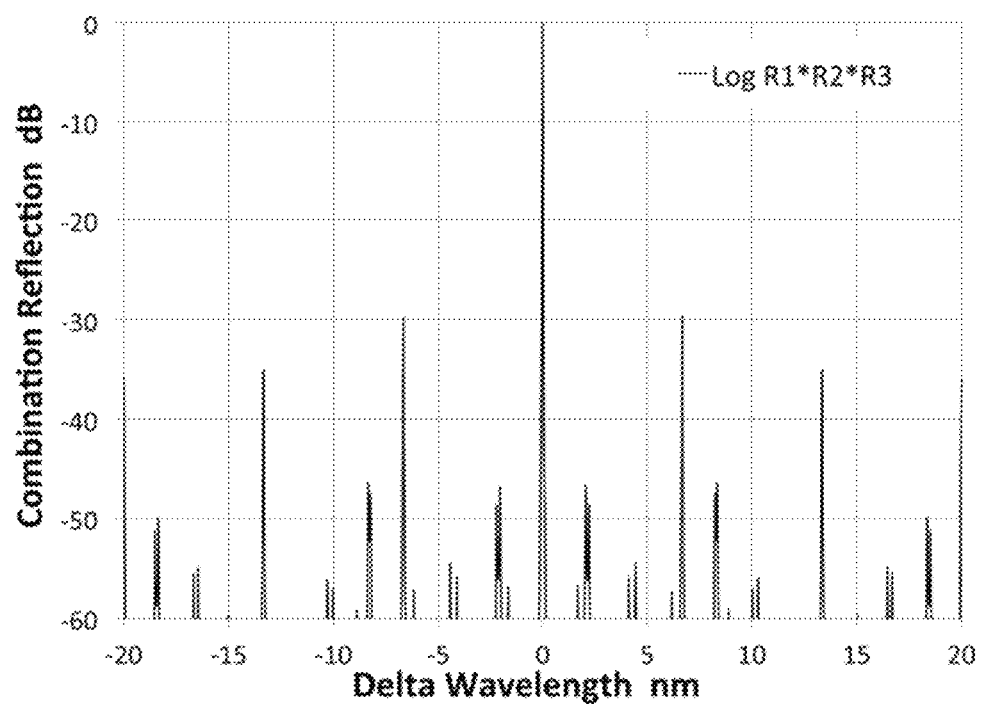
FIG. 4 Calculated power reflection spectrum for a 3 ring laser reflector using low loss $Si_3N_4$ waveguides and ring radii of 100, 108 and 133 microns.

Using larger ring radii also reduces the required Q factor of a reflector/filter design, and therefore increases the high power capability of the design. As an example, FIG. 4 shows the simulated power reflectivity of a reflector made from the combination of 3 microresonators, using ring radii of 100, 108 and 133 microns; this 3 ring design provides significantly more suppression of sidemodes, of almost 30 dB, compared to the two microresonator design shown in FIG. 2, which, using radii of 50 and 55 microns showed only 2 dB of mode suppression. In the reflection spectra in FIGS. 2 and 4, the microresonator resonances are aligned at the center wavelength, and then from differences in ring circumference and therefore their FSR, the ring resonances are misaligned at other wavelengths. In FIG. 4, each microresonator is designed with a −3 dB bandwidth of 4 GHz, from the choice of coupling coefficient. The black lines show the combined response of the 3 microresonators (each of the responses multiplied together), plotted on a log scale, By comparison, the simulated reflector response shown in FIG. 2(*b*) showed sidemodes of the reflector at a reflectivity as high as 0.63 compared to the main reflection, or only 2 dB suppression.

Figure 5:
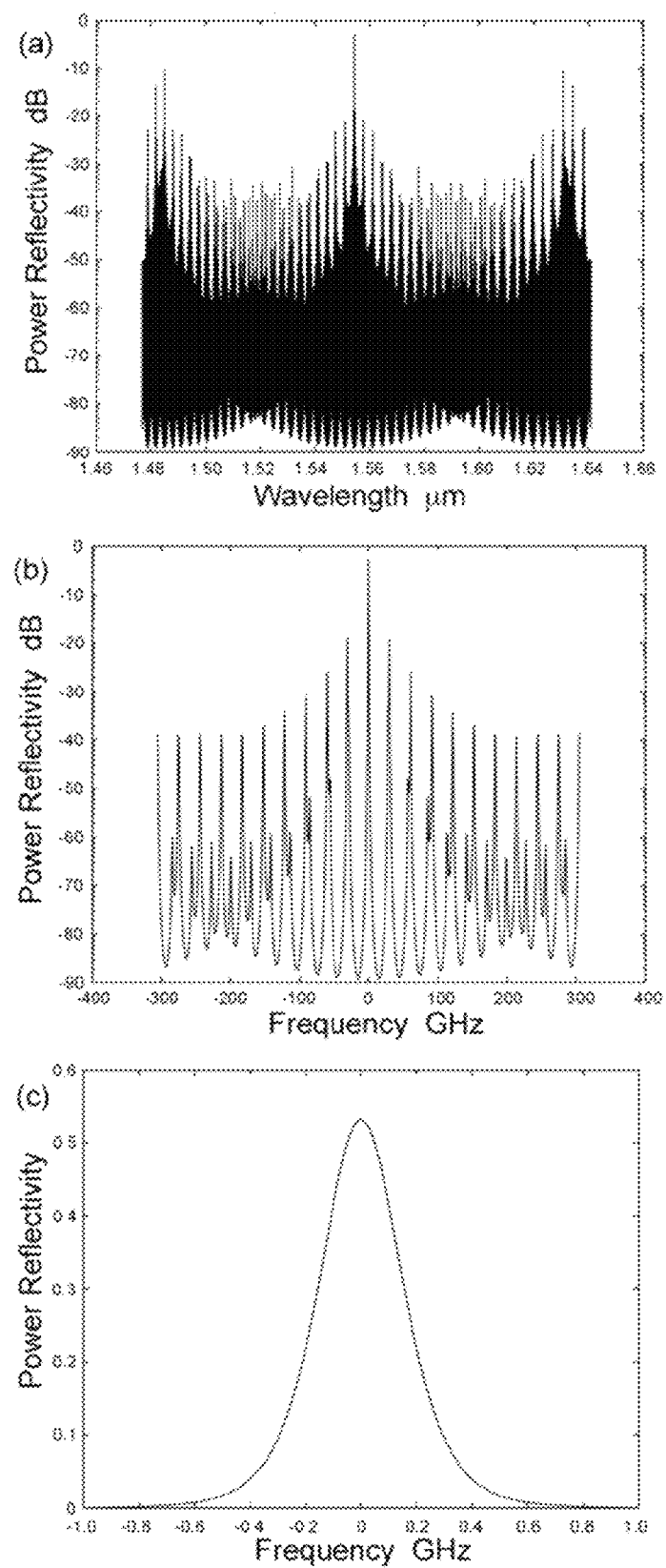
FIG. 5 Calculated power reflection spectra for a 3 ring laser reflector using ultra-low loss $Si_3N_4$ waveguides and ring radii of 1.0 mm, 1.00332 mm, and 1.07443 mm (Ring radii resonance frequencies chosen to align near 1550 nm). (a) shows the broad spectrum, (b) shows a closer look at the central and close in reflection peaks, and (c) shows a zoom in view of the central reflection peak.

Using this 3 microresonator approach with ultra-low loss Si$_3$N$_4$ waveguide designs that provide significantly lower loss, e.g. 10× lower loss, or 0.02 dB/cm, at significantly larger ring radii (≥1 mm), it is possible to obtain good mode suppression over a very wide range of wavelengths, while at the same time providing a very narrow filter bandwidth, a longer effective cavity length; and therefore much lower laser linewidth, while keeping the reflector loss low enough to support high power operation. An example of the combination reflection spectrum of a reflector using 3 ring radii close to 1 mm radius (1 mm, 1.00332 mm and 1.07443 mm) is shown in FIG. 5, with FIG. 5(*a*) showing the spectrum over a very wide wavelength range, FIG. 5(*b*) for a narrower wavelength/frequency range around the central reflection peak, and FIG. 5(*c*) showing a zoomed in region around the reflection peak. These spectra show a very wide wavelength range with good mode selectivity, i.e. >130 nm (which could support a very broadband; e.g. >50 nm, tunable laser), together with around 17 dB of suppression of the next largest reflection, a reflection full width at half maximum (FWHM) of only 0.4 GHz, and an effective length for the reflector of 67 mm—which would provide a Schawlow Townes linewidth for the laser of ~50 Hz at only 10 mW of output power.

Figure 6:
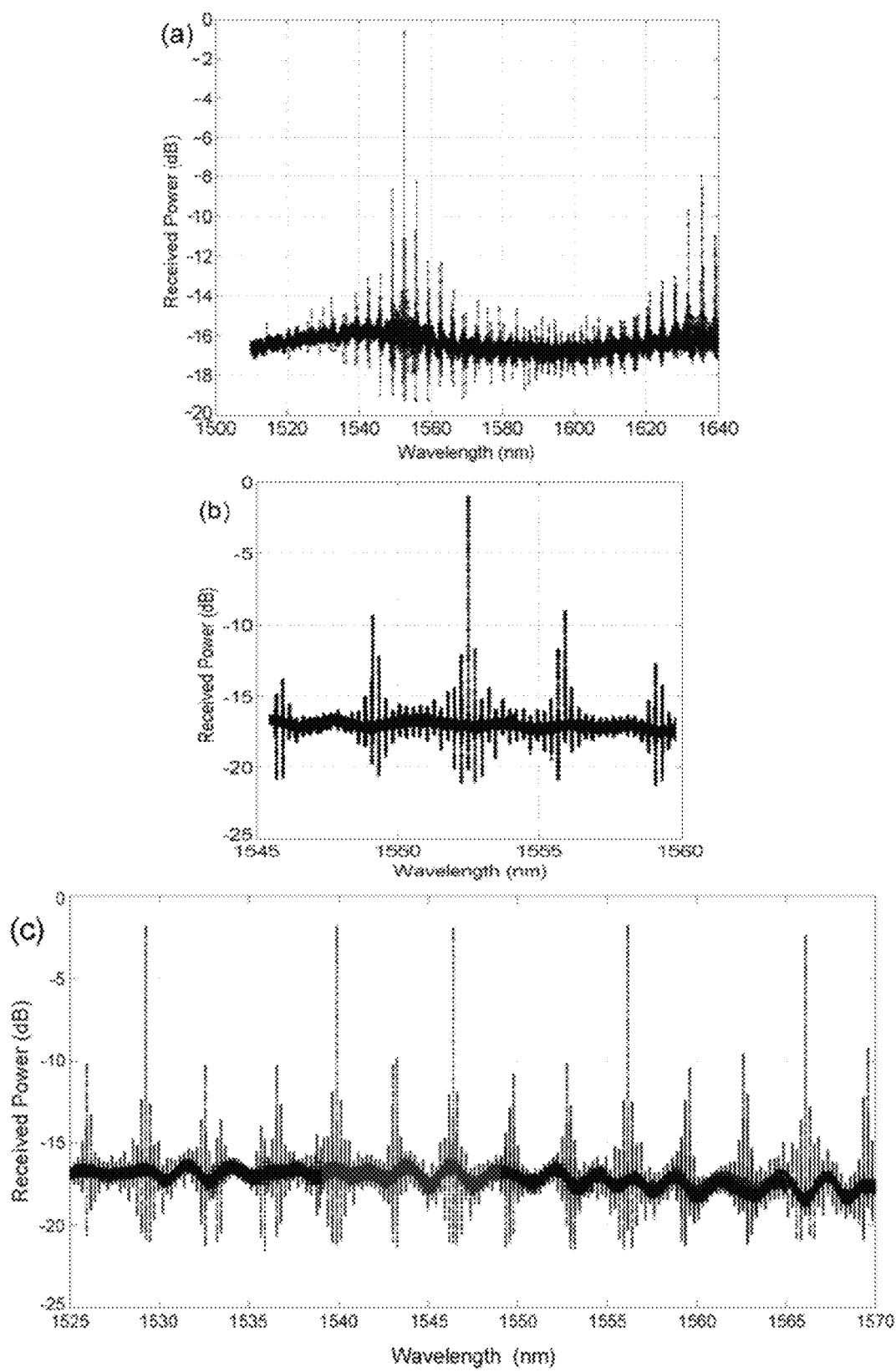
FIG. 6 Measured reflection spectra of a fabricated ultra-low loss 3 ring reflector device. (a) shows the broad spectrum, (b) shows a closer look at the central and close in reflection peaks, and (c) shows the tunability of the reflector—with multiple reflection spectra superimposed upon each other showing tunability across the full C-Band (1530 nm to 1565 nm).

Experimental measurements of the first fabricated ultra-low loss reflectors are shown in FIG. 6; these devices were based on the design used for the modeled results in FIG. 5. The reflection spectra for a 3 ring reflector show the suppression of additional potential lasing modes over an extended wavelength range (>120 nm) in FIG. 6(*a*), with a plot over a more narrow wavelength range in FIG. 6(*b*) showing the expected close in reflection peak structure. FIG. 6(*c*) shows a superposition of multiple measurements of reflection spectra taken with the reflector tuned to different wavelengths—showing tunability beyond the C-Band (1530 nm to 1565 nm) wavelength range. The measurement spectra in FIG. 6 confirm the operation of the 3 ring reflector design described in this invention.

Figure 7:
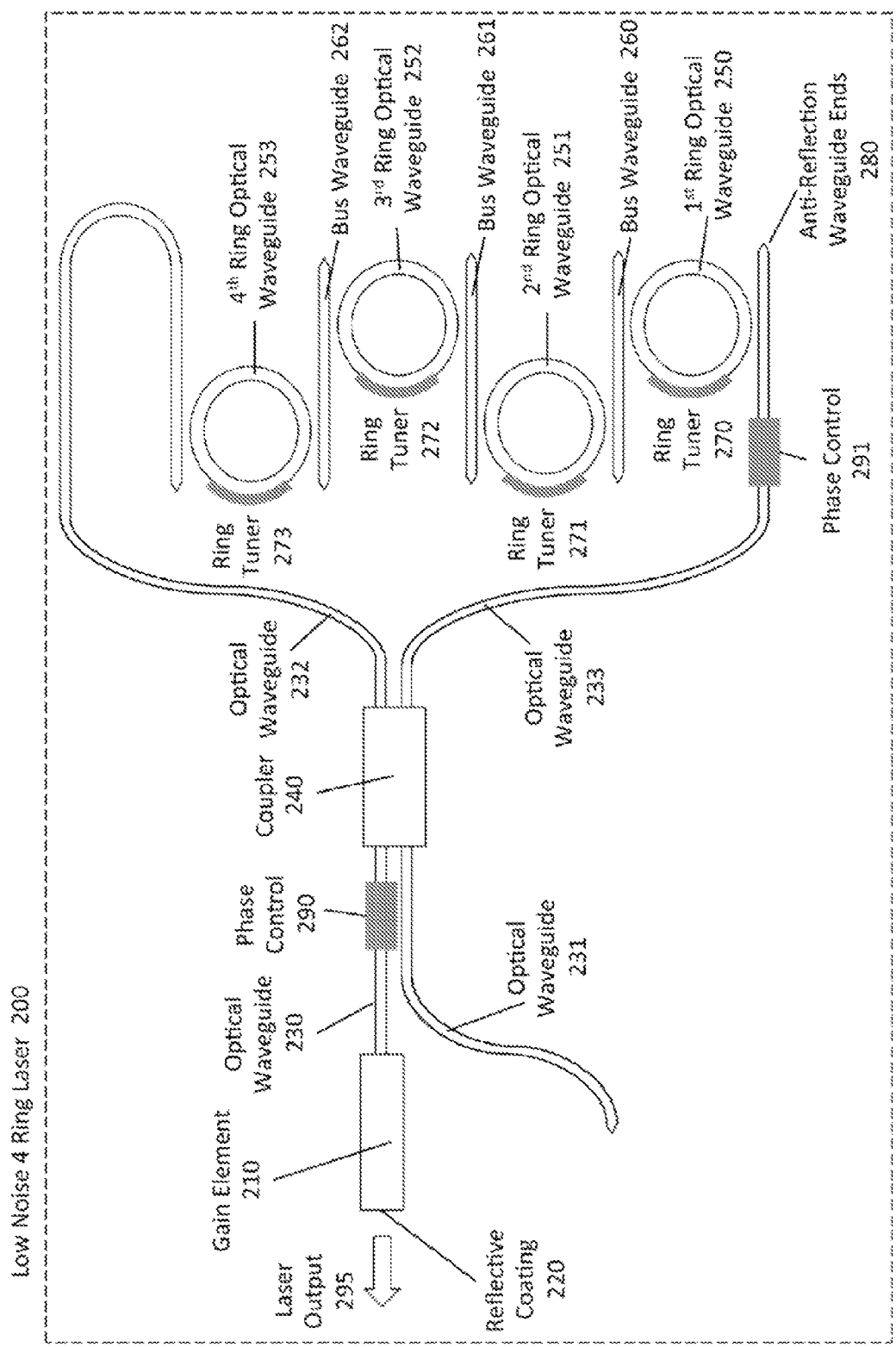
FIG. 7 Schematic of the 4 microresonator ring linear cavity laser design.

As the chosen microresonator radius is increased further in order to lower the loss, the selectivity of the filter structure becomes insufficient to choose only one lasing mode within the broad bandwidth of the gain element (also allowing for the laser to be tunable), even when using 3 microresonators with different and optimized circumferences, in which case the filter structure can be increased to include 4 microresonators—and the different circumferences of the 4 microresonators then optimized using the 'modified Vernier' effect, to provide the overall required filter function; feedback at only one wavelength over a wide wavelength range (e.g. >130 nm), high suppression of all other potential lasing modes (e.g. >15 dB), narrow bandwidth and long effective cavity length for very narrow linewidth operation (e.g. GHz or sub-GHz bandwidth, multiple cm cavity length) and low total filter loss (e.g. <2 dB). A schematic of one embodiment of a 4 microresonator ring based low noise laser source 200 is shown in FIG. 7, in which an optical signal 295 at a single wavelength is created through the combination of the gain element 210 and the mode selection achieved in the laser cavity. The laser cavity is comprised of the broadband reflective coating 220 at one end of the gain element that is chosen to be less than 100% reflective in order to provide the laser output signal 295, plus the Sagnac Loop reflector that creates the other end of the linear laser cavity, the Sagnac loop reflector being comprised of 4 ring optical waveguides (250, 251, 252 and 253) with different ring radii (and therefore different FSR) interconnected with bus waveguides 260, 261 and 262—the loop reflector providing a long effective cavity length plus the required mode selectivity. The gain element 210 is connected to the optical waveguide of the laser cavity 230 either directly for a monolithic (e.g. silicon photonics based) device, or through hybrid integration (e.g. with a lens) for a hybrid integrated laser. The Sagnac loop comprises a coupler 240, either a 2×2 directional coupler as shown in FIG. 3, or alternative coupler designs. In the preferred embodiment, a 50%/50% coupler is used to split the optical power coming from the gain element into the two optical waveguides 232 and 233, which pass through a phase control element 291 and the 4 ring optical waveguides 250, 251, 252 and 253, before being re-combined at the coupler to complete the Sagnac loop and provide a wavelength selective reflector for the laser cavity with all of the energy reflected back to the gain element. If a different splitting ratio is achieved, either by design or by utilizing a tunable coupler for 240, an output can be taken from the waveguide of the coupler, i.e. the optical waveguide 231. Anti-reflection waveguide ends 280 (e.g. waveguides tapered down to a zero width over a long length) are added to the ends of all unused optical waveguides to avoid optical reflections at those waveguide ends from degrading the reflection response of the Sagnac loop based wavelength selective optical reflector. The resonance frequencies of each of the 4 ring optical waveguides 250, 251, 252 and 253, can be independently tuned using ring tuners 270, 271, 272 and 273 respectively. The phase control element 290 controls the laser cavity phase in order to control the exact wavelength of the lasing mode relative to the reflector peak wavelength. The Sagnac loop reflector phase control 291, together with the resonance frequency ring tuners of the 4 rings 270, 271, 272 and 273 are used to control the peak reflection wavelength of the Sagnac loop based reflector. The wavelength of the laser is chosen by aligning all of the ring optical wavelengths near the desired optical wavelength, then aligning the reflector phase and cavity phase to place the optical cavity mode at the desired wavelength relative to the reflector peaks.

Figure 8:
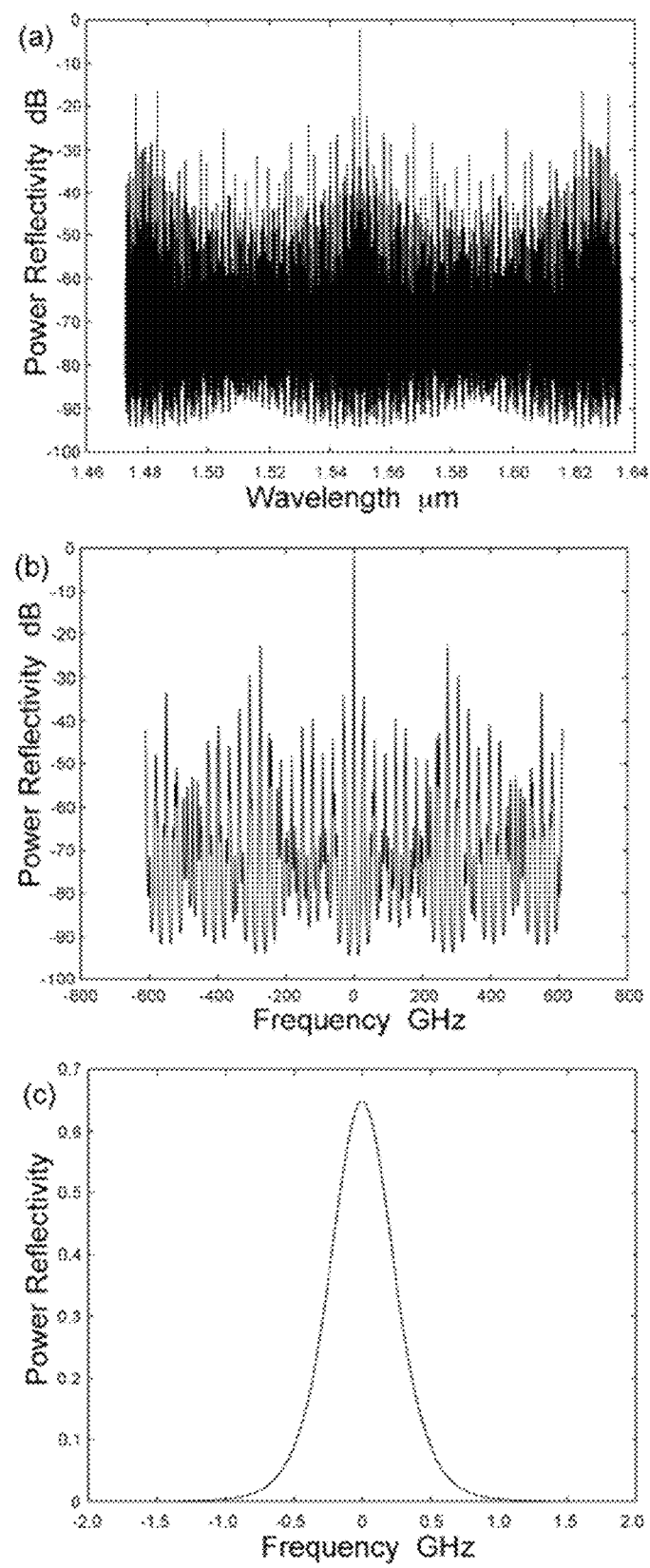
FIG. 8 Calculated power reflection spectra for a 4 ring laser reflector using ultra-low loss $Si_3N_4$ waveguides and ring radii of 1.0 mm, 1.00332 mm, 1.09829 mm and 1.22503 mm (Ring radii resonance frequencies chosen to align near 1550 nm). (a) shows the broad spectrum, (b) shows a closer look at the central and close in reflection peaks, and (c) shows a zoom in view of the central reflection peak.

An example of the reflection spectra from a 4 microresonator ring based reflector, with ring radii close to 1 mm radius (1 mm, 1.00332 mm, 1.09829 and 1.22503 mm) is shown in FIG. 8; here the $4^{th}$ microresonator is used to allow high mode suppression, >20 dB over a wide wavelength range, while providing a wider bandwidth (0.9 GHz), lower effective cavity length (47 mm), however, also higher peak reflectivity, The $4^{th}$ microresonator therefore can provide additional freedom in the optimization of different laser reflector parameters, depending on the chosen laser application and required performance.

Figure 9:
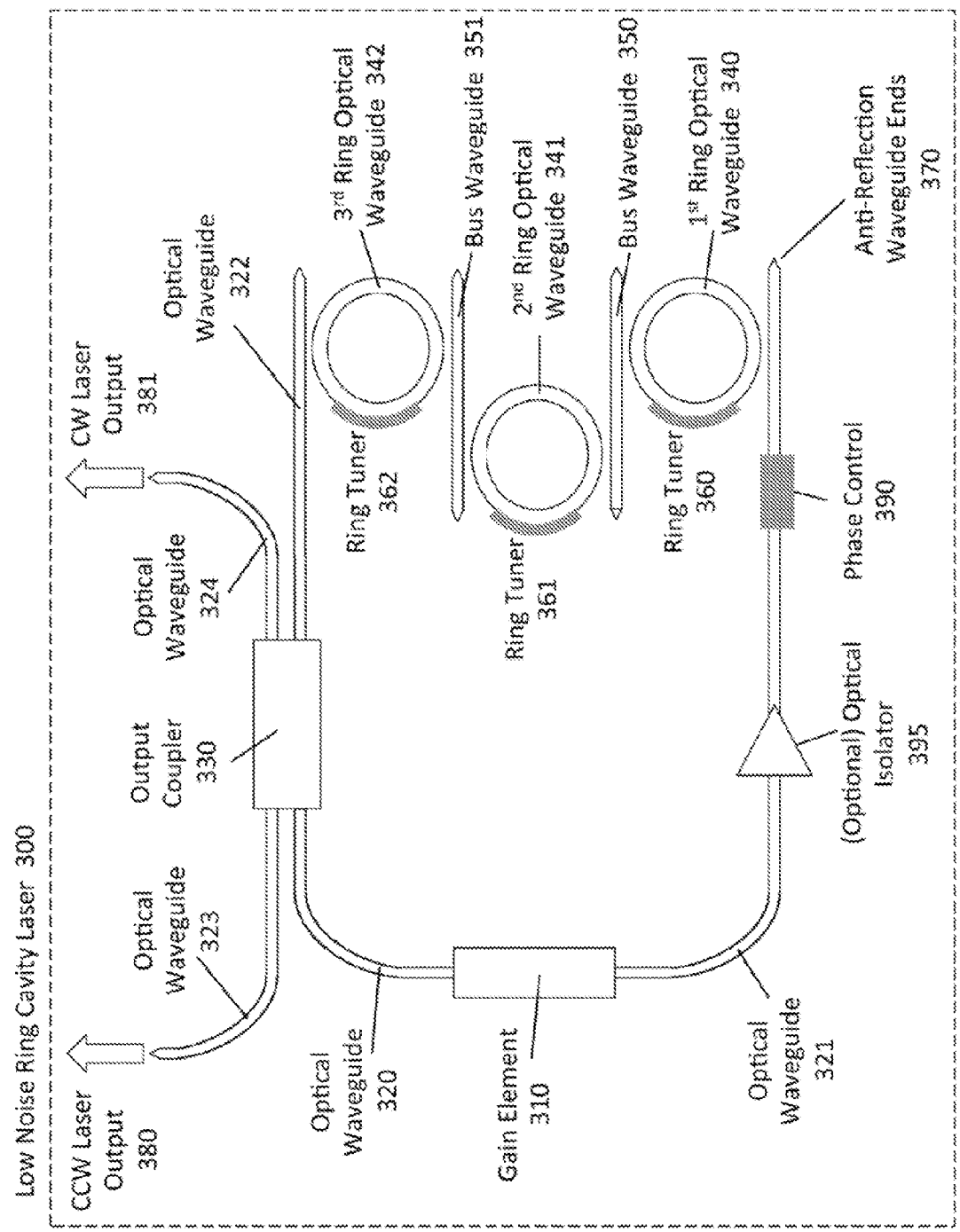
FIG. 9 Schematic of a ring laser cavity utilizing 3 rings in the filter design.

The total number of microresonator rings, each with a different circumference and therefore different FSR, can be increased as necessary to provide the required filter function, as well as each microresonator circumference optimized. The microresonators can be ring shaped, racetrack shaped, or any arbitrary shape that has the same overall effect of a looped waveguide. The downside to increasing the number of microresonators too far is the need to tune the resonance frequency of each microresonator to obtain the correct filter function, which becomes more difficult as the number of microresonators increases. Additionally, the design process for a higher number of microresonators can become more difficult—however, this design process can be optimized numerically. A ring laser structure is good for low noise laser designs because it does not include any laser facets (cavity end reflections), so that for unidirectional oscillation the ring eliminates standing waves and therefore spatial hole-burning effects. Additionally, the ring design is far less susceptible to residual optical reflections within the laser cavity that would provide parasitic Fabry-Perot modes with the large facet reflections in a linear laser design. Using a monolithic integrated or heterogeneously integrated approach, where the gain element is fabricated along with the waveguides and microresonators, a ring laser can be fabricated utilizing the microresonator based filters described previously for the linear cavity, but with the filters used in pass through mode rather than as a reflector. A schematic for one embodiment of an ultra low noise ring laser 300 is shown in FIG. 9, which utilizes similar components to the 3 ring laser in FIG. 3, however, arranged in a ring cavity rather than a linear cavity. The gain element 310 is part of the ring cavity together with a 3 ring wavelength selective filter for mode selectivity and to extend the cavity length, plus a phase control element 390 to control the lasing mode, and a coupler 330 to couple part of the optical signal out of the ring cavity. The gain element 310 is coupled to waveguide 321, through an optional optical isolator 395, through a phase control element 390, then through the 3 rings of the filter 340, 341 and 342, using interconnecting bus waveguides 350 and 351, into the optical waveguide 322 and through the output coupler 330, before completing the ring with optical waveguide 320 into the other end of the gain element 310. The resonance frequencies of the 3 ring optical waveguides are controlled by the 3 ring tuners 360, 361 and 362. Anti-reflection waveguide ends 370 (e.g. waveguides tapered down to a zero width over a long length) are added to the ends of all unused optical waveguides to avoid optical reflections at those waveguide ends from degrading the response of the wavelength selective optical filter. The ring laser operating without an optical isolator will have two counter-propagating optical signals, which are coupled out of the ring cavity by the coupler 330, through the 2 optical waveguides 323 and 324, to provide the Counter-Clockwise (CCW) Laser Output 380 and the Clockwise (CW) Laser Output 381.

One option for a ring laser, as shown in FIG. 9, includes an isolator 395 within the ring to ensure single direction lasing; appropriate isolators integrated with silicon photonics waveguides and microresonators have been demonstrated, such as described in "The on-chip integration of magnetooptic waveguide isolators" by M. Levy, IEEE JOURNAL of SELECTED TOPICS in QUANTUM ELECTRONICS, 8, pages 1300 to 1306, 2002. The ring laser can be designed using ultra-low loss waveguides to create devices with 3 microresonators, 4 microresonators, or more, as required to obtain the required mode selectivity and laser performance.

Without an isolator within the ring cavity, the device will tend to operate with two lasing modes, one in each ring direction, due to the symmetry of the device. This dual output (in opposite ring direction) operation is very useful in certain applications, in particular for fabricating a ring laser based gyroscope. Using this approach it will be possible to integrate the entire ring laser based gyroscope device, including combining the two outputs in an integrated detector to create the beat frequency (related to the rotation of the device), in a single Photonic Integrated Circuit (PIC) device. Using ultra-low loss integrated waveguides, the ring structure can be extended through many spirals of the waveguide to increase the gyroscope sensitivity.

Figure 10:
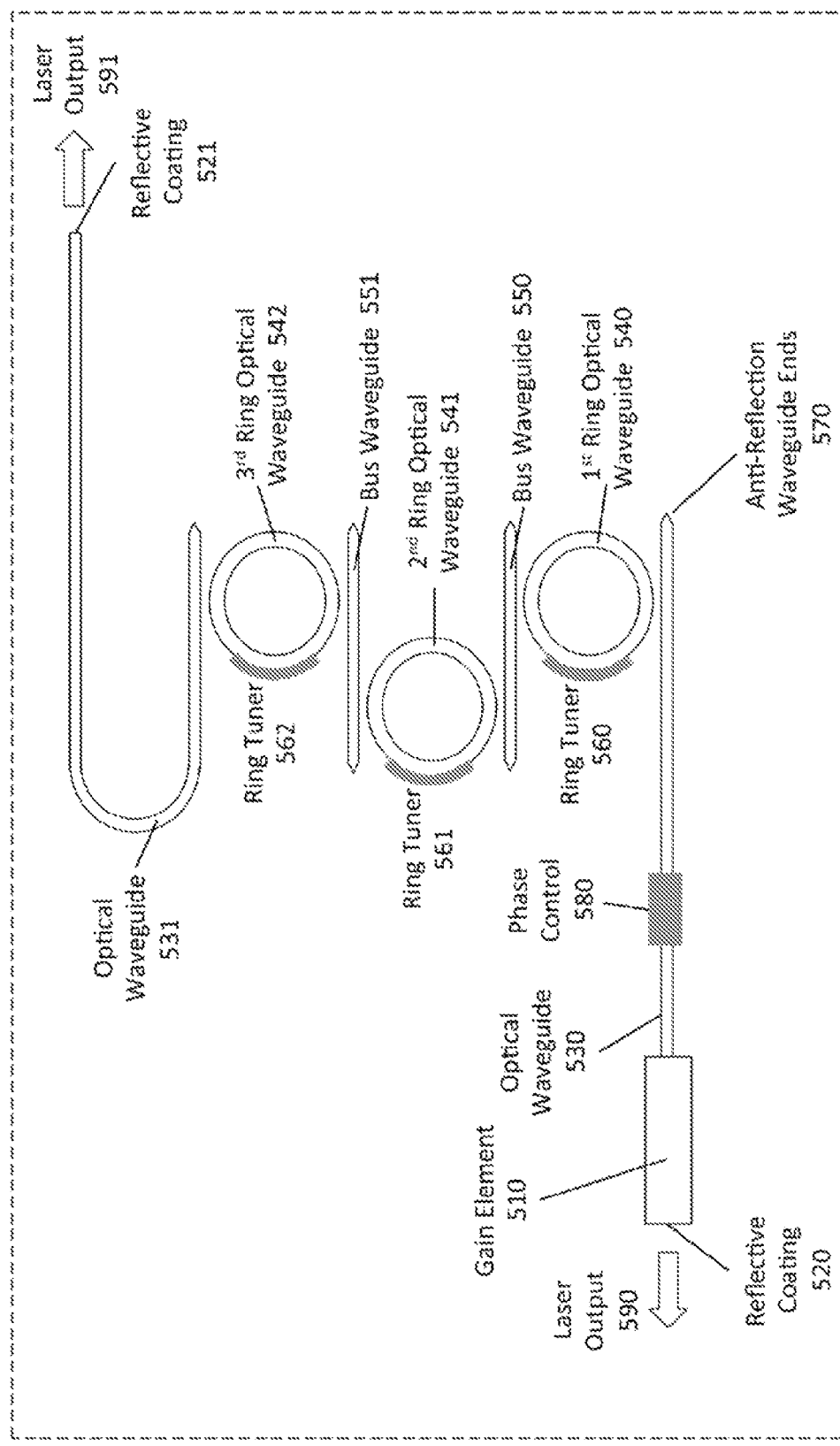
FIG. 10 Schematic of a linear cavity design with reflective coatings on both ends of the laser cavity and one 3 ring filter in a double pass configuration.

The linear laser designs shown in FIGS. 3 and 7 use the microresonator rings in a Sagnac configuration, providing feedback from the combined 3 or 4 ring Sagnac loop based wavelength selective reflector. An alternative cavity configuration that has a reflective coating at both ends of a linear cavity, eliminating the Sagnac loop, is used in the two laser designs shown in FIGS. 10 and 11. In FIG. 10, a 3 ring filter is used with a reflective coating placed after the third ring to provide an ultra low noise laser with a linear cavity and double pass 3 ring filter configuration 500. The overall effect is a filter function produced from the 3 ring responses, each with a different FSR, the filter function being utilized twice within a single pass around the laser cavity. The gain element 510 has a broadband reflective coating on one end 520, through which the output 590 can be taken (depending on the reflectivity of the reflective coating 520), while the other side of the gain element is connected to optical waveguide 530, through the phase control element 580 to the 3 ring filter. The 3 ring wavelength selective filter is comprised of ring optical waveguides 540, 541 and 542, interconnected by bus waveguides 550 and 551; the top ring 542 being connected to an optical waveguide 531 leading to a reflective coating 521 that forms the second end of the laser cavity—through which the laser output 591 can be taken (depending on the reflectivity of the reflective coating 521). The broadband reflective coating 521 reflects light back into the laser cavity, through the 3 ring wavelength selective filter, taking a second pass through this filter, before passing back through the phase control section 580 and optical waveguide 530 back to the gain element 510. The resonance frequencies of the 3 ring optical waveguides are controlled by the 3 ring tuners 560, 561 and 562. Anti-reflection waveguide ends 570 (e.g. waveguides tapered down to a zero width over a long length) are added to the ends of all unused optical waveguides to avoid optical reflections at those waveguide ends from degrading the response of the wavelength selective optical filter. The laser output can be taken from either end (or both ends) of the laser cavity by selecting appropriate reflective coating values 520 and 521, the values reduced from 100% to provide the laser output.

Figure 11:
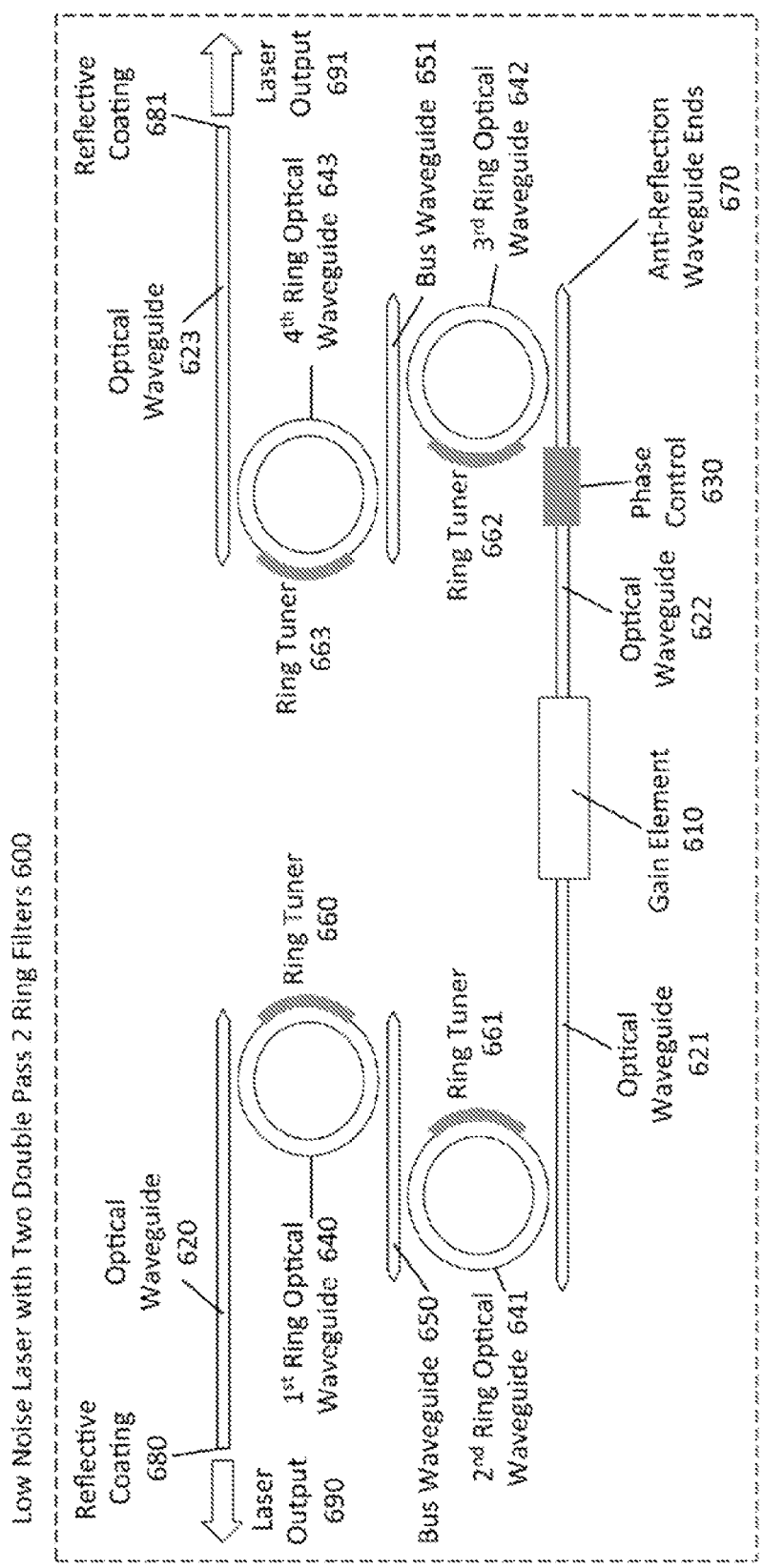
FIG. 11 Schematic of a linear cavity design with reflective coatings on both ends of the laser cavity and two filters, one on each side of the gain element in a double pass configuration, each filter incorporating 2 rings (4 rings total in laser cavity).

FIG. 11 shows an alternative linear cavity arrangement with reflective coatings at both ends of the cavity, in which a microresonator ring filter is placed on either side of the gain element; in this case a 2 ring filter is placed on either side of the gain element, each of the 4 rings in the laser cavity having a different FSR. This low noise linear laser with 2 dual pass ring filters 600 is similar to the design in FIG. 10, however, having ring optical waveguides on both sides of the gain element—in this case 2 rings on the left 640 and 641, and two rings on the right 642 and 643, these 4 rings providing double pass filtering during one laser cavity round trip, with 4 different ring radii utilized. Any number of rings (≥3) can be utilized in the two linear cavity double pass filter designs shown in FIGS. 10 and 11, with rings on one or both sides of the gain element, having either an equal or an unequal number of rings on each side of the gain element. In FIG. 11 the gain element 610 is connected to optical waveguides 621 and 622, each connected to a 2 ring filter 640/641, and 642/643, which are interconnected by bus waveguides 650 and 651, before connecting to optical waveguides with a reflective coating; 620/680, and 623/681, providing respective optical outputs 690 and 691 (depending on the reflectivity of the reflective coatings). The cavity phase is controlled by phase control element 630, and the 4 ring optical waveguides 640-643 have their resonance frequencies tuned by ring tuners 660-663 respectively. Anti-reflection waveguide ends 670 (e.g. waveguides tapered down to a zero width over a long length) are added to the ends of all unused optical waveguides to avoid optical reflections at those waveguide ends from degrading the response of the two wavelength selective optical filters. The laser output can be taken from either end (or both ends) of the laser cavity by selecting appropriate reflective coating values 680 and 681, the values reduced from 100% to provide the laser output.

The microresonator rings in the laser designs, as well as the phase control elements (see FIGS. 3, 7, 9, 10 and 11) are each tuned to control either the resonance frequency of the microresonator ring, or the reflector or cavity phase with the phase control elements. Tuning can be accomplished by a number of mechanisms, e.g. thermal tuning of the waveguide index by placing a heater near to the waveguide structure of the relevant component (microresonator or waveguide), or electro-stress tuning of the waveguide index using Lead Zirconate Titanate (PZT) or other transducers, Liquid Crystal based waveguide index tuning, Micro-Electro-Mechanical System (MEMS) based physical tuning of the waveguide geometry, or other relevant mechanisms to tune the resonance frequency of the microresonator and optical phase of the phase control sections.

The description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A source of coherent radiation, comprising:
an optical resonant cavity having a gain element with one partially reflecting mirror for reflecting a part of radiation back inside the cavity and partially outputting a laser emission;
a directional coupler, the coupler splitting incoming radiation into clockwise and counterclockwise beams; the beams passing through a Sagnac loop;
the loop incorporating at least a first, a second and a third ring microresonators interconnected via intermediate bus waveguides so that none of the rings directly couples to one another;
the first ring, the second ring and the third ring having similar radii, varying by less than 7.5% of the smaller radius with different sets of resonant frequencies; and wherein one resonant frequency is common for all three rings and there is no other resonant frequency over a wavelength range of at least 40 nm;
the clockwise and counterclockwise beams recombine coherently in the directional coupler;
the coupler outputs an obtained combined beam into the gain element.

2. The source of claim 1, further comprising a phase control providing a single mode operation of the source.

3. The source of claim 1, wherein each ring has its ring tuner for tuning sets of resonant frequencies of each ring.

4. The source of claim 1, further comprising a fourth ring connected to the third ring via an additional bus, the fourth ring having a set of frequencies being different from all sets of frequencies for the first, the second and the third rings, and the fourth ring having one frequency common with all three other rings.

5. A method to produce laser emission, comprising:
generating spontaneous radiation in a gain element in a cavity; wherein the cavity incorporating, a Sagnac loop;
splitting incoming radiation via a directional coupler into clockwise and counterclockwise beams;
passing the beams through the Sagnac loop;
filtering the radiation by passing it through at least three rings, having similar radii, varying by less than 7.5% of the smaller radius, connected via intermediate bus waveguides, so that none of the rings directly couples to one another;
assuring that the rings have different sets of resonant frequencies wherein one resonant frequency is common for all three rings, and there is no other resonant frequency over a wavelength range of at least 40 nm;
recombining the clockwise and counterclockwise beams coherently in the directional coupler;
outputting an obtained combined beam into the gain element via the coupler; and
partially reflecting the radiation from at least one reflecting surface back to the cavity and partially outputting a laser emission.

6. A source of coherent radiation, comprising:
an optical resonant cavity in a form of a ring laser cavity;
a gain element;
a waveguide connecting the gain element with a first ring microresonator;

the ring laser cavity incorporating at least the first, a second and a third ring microresonators interconnected via intermediate bus waveguides, so that none of the rings directly couples to one another;

the first ring, the second ring and the third ring microresonators having similar radii, varying by less than 7.5% of the smaller radius with different sets of resonant frequencies;

and wherein one resonant frequency is common for all three ring microresonators and there is no other resonant frequency over a wavelength range of at least 40 nm;

wherein the ring laser cavity incorporates a coupler; the coupler having four ports; the ring laser cavity being connected to the coupler through two ports; and the coupler forming a part of the ring laser cavity by letting a part of radiation going through the coupler directly back into the ring laser cavity without reflection; and two other ports serving to output a laser emission.

7. The source of claim 6, further comprising a phase control providing a single mode operation of the source.

8. The source of claim 7, further comprising tuners at each ring.

9. The source of claim 8, further comprising an optical isolator in the ring laser cavity.

10. The source of claim 6, wherein three rings having radii of 1 mm, 1.00332 mm and 1.07443 mm.

* * * * *